(12) United States Patent
Yan et al.

(10) Patent No.: US 11,448,932 B2
(45) Date of Patent: Sep. 20, 2022

(54) ARRAY SUBSTRATE AND MANUFACTURING METHOD THEREOF

(71) Applicant: WUHAN CHINA STAR OPTOELECTRONICS TECHNOLOGY CO., LTD., Hubei (CN)

(72) Inventors: Yuan Yan, Hubei (CN); Jiyue Song, Hubei (CN)

(73) Assignee: WUHAN CHINA STAR OPTOELECTRONICS TECHNOLOGY CO., LTD., Hubei (CN)

(\*) Notice: Subject to any disclaimer, the term of this patent is extended or adjusted under 35 U.S.C. 154(b) by 123 days.

(21) Appl. No.: 16/476,292

(22) PCT Filed: Apr. 16, 2019

(86) PCT No.: PCT/CN2019/082786
§ 371 (c)(1),
(2) Date: Jul. 7, 2019

(87) PCT Pub. No.: WO2020/133808
PCT Pub. Date: Jul. 2, 2020

(65) Prior Publication Data
US 2020/0209694 A1 Jul. 2, 2020

(30) Foreign Application Priority Data
Dec. 29, 2018 (CN) .......................... 201811636993.6

(51) Int. Cl.
*H01L 21/3205* (2006.01)
*G02F 1/1362* (2006.01)
(Continued)

(52) U.S. Cl.
CPC .. *G02F 1/136277* (2013.01); *G02F 1/136286* (2013.01); *H01L 21/3247* (2013.01);
(Continued)

(58) Field of Classification Search
CPC ........... H01L 29/4908; H01L 29/66742; H01L 29/6675; H01L 29/66757; H01L 29/786;
(Continued)

(56) References Cited

U.S. PATENT DOCUMENTS

2013/0134399 A1 5/2013 Zhang et al.
2017/0069667 A1\* 3/2017 Chen .................... G02F 1/13318
(Continued)

FOREIGN PATENT DOCUMENTS

CN  107037651 A  8/2017
CN  108538861 A  9/2018
(Continued)

*Primary Examiner* — Monica D Harrison
*Assistant Examiner* — John Lin
(74) *Attorney, Agent, or Firm* — Mark M. Friedman

(57) ABSTRACT

An array substrate and a manufacturing method thereof in the embodiment of the present invention can complete the process of the array substrate with the touch function by using six photolithography processes, thereby simplifying the production process, saving cost, and shortening the production cycle.

16 Claims, 13 Drawing Sheets

(51) Int. Cl.
    *H01L 21/3213*    (2006.01)
    *H01L 21/324*     (2006.01)

(52) U.S. Cl.
    CPC .. *H01L 21/32055* (2013.01); *H01L 21/32132* (2013.01); *G02F 1/136295* (2021.01); *G02F 2201/121* (2013.01); *G02F 2201/123* (2013.01)

(58) Field of Classification Search
    CPC ......... H01L 29/78651; H01L 29/78672; H01L 29/78675; H01L 29/78621; H01L 29/41733; H01L 21/32132; H01L 27/127; H01L 27/1288; H01L 21/32055; H01L 21/3247; H01L 21/41733; G02F 1/136286; G02F 1/13338; G02F 2201/123; G02F 2201/121
    See application file for complete search history.

(56) References Cited

U.S. PATENT DOCUMENTS

| | | | |
|---|---|---|---|
| 2017/0222059 A1* | 8/2017 | Chen | H01L 27/1222 |
| 2018/0358382 A1 | 12/2018 | Zhao | |
| 2019/0006521 A1* | 1/2019 | Noh | H01L 29/78618 |
| 2019/0050091 A1 | 2/2019 | Hong et al. | |

FOREIGN PATENT DOCUMENTS

| | | |
|---|---|---|
| CN | 108550581 A | 9/2018 |
| CN | 108695342 A | 10/2018 |

\* cited by examiner

ARRAY SUBSTRATE AND MANUFACTURING METHOD THEREOF

FIELD OF INVENTION

The present invention relates to the field of display technologies, and in particular, to an array substrate and a manufacturing method thereof.

BACKGROUND OF INVENTION

In order to effectively reduce the price of liquid crystal displays and improve their yield, manufacturing process of the array substrate is gradually simplified, and generally adopts a 12-channel photolithography process. Although this process is relatively mature, there are still problems of complicated production processes, high production costs, and long production cycles.

Technical Problem

The object of the embodiments of the present invention is to provide an array substrate and a manufacturing method thereof, which can solve the technical problems of the prior art of the array substrate being complicated, the production cost is high, and the production cycle is long.

Technical Solution

An embodiment of the present invention provides a method for manufacturing an array substrate, comprising:

depositing a buffer layer and a source-drain metal layer on a substrate in sequence, performing a first photolithography process to form a source electrode, a drain electrode, and a touch line;

depositing a polysilicon layer, performing a second photolithography process to form a conductive channel, the conductive channel being disposed between the source electrode and the drain electrode, and contacting with the source electrode and the drain electrode;

depositing a gate insulating layer and a pixel electrode layer in sequence, performing a third photolithography process to form a pixel electrode, forming a first via hole in the gate insulating layer above the touch line, and forming a second via hole in the gate insulating layer above the drain electrode;

depositing a gate metal layer, performing a fourth photolithography process to form a gate electrode, a first connection electrode, and a second connection electrode, wherein the first connection electrode is connected to the touch line through the first via hole, the second connection electrode is connected to the drain electrode through the second via hole, and forming a lightly doped area and a heavily doped area in the conductive channel;

depositing a flat layer, performing a fifth photolithography process to form a third via hole in the flat layer above the first connection electrode; and depositing a common electrode layer, performing a sixth photolithography process to form a touch electrode and a common electrode, wherein the touch electrode is connected to the first connection electrode through the third via hole;

wherein the step of depositing the buffer layer and the source-drain metal layer on the substrate in sequence, performing the first photolithography process to form the source electrode, the drain electrode, and the touch line includes:

depositing the buffer layer, the source-drain metal layer and the first photoresist layer on the substrate in sequence, exposing and developing the first photoresist layer by using a first mask to form a first photoresist pattern;

etching the source-drain metal layer with the first photoresist pattern as a mask to form the source electrode, the drain electrode, and the touch line, and removing the first photoresist pattern;

the step of depositing the polysilicon layer, performing the second photolithography process to form the conductive channel includes:

depositing an amorphous silicon layer, and performing laser annealing on the amorphous silicon layer to form the polysilicon layer;

depositing a second photoresist layer on the polysilicon layer, exposing and developing the second photoresist layer using a second mask to form a second photoresist pattern; and etching the polysilicon layer by using the second photoresist pattern as a mask to form the conductive channel, and removing the second photoresist pattern.

In the manufacturing method of an array substrate of the present invention, the step of depositing the gate insulating layer and the pixel electrode layer in sequence, performing the third photolithography process to form the pixel electrode, forming the first via hole in the gate insulating layer above the touch line, and forming the second via hole in the gate insulating layer above the drain electrode includes:

depositing the gate insulating layer, the pixel electrode layer and the third photoresist layer in sequence, exposing and developing the third photoresist layer by using a third mask to form a third photoresist pattern;

etching the pixel electrode layer and the gate insulating layer with the third photoresist pattern as a mask to form the first via hole in the gate insulating layer above the touch line, and to form the second via hole in the gate insulating layer above the drain electrode;

performing an ion bombardment on the third photoresist pattern with oxygen to form a fourth photoresist pattern; and etching the pixel electrode layer with the fourth photoresist pattern as a mask to form the pixel electrode, and removing the fourth photoresist pattern.

In the manufacturing method of an array substrate of the present invention, the step of etching the pixel electrode layer and the gate insulating layer with the third photoresist pattern as a mask to form the first via hole in the gate insulating layer above the touch line, and to form the second via hole in the gate insulating layer above the drain electrode includes:

performing a wet etching process, etching the pixel electrode layer with the third photoresist pattern as a mask to remove the pixel electrode layer above the touch line, and removing the pixel electrode layer on the drain electrode; and performing a dry etching process, etching the gate insulating layer with the third photoresist pattern as a mask to remove the gate insulating layer above the touch line, and removing the gate insulating layer on the drain electrode.

In the manufacturing method of an array substrate of the present invention, the third mask is a halftone mask.

In the manufacturing method of an array substrate of the present invention, the step of depositing the gate metal layer, performing the fourth photolithography process to form the gate electrode, the first connection electrode, and the second connection electrode, wherein the first connection electrode is connected to the touch line through the first via hole, the second connection electrode is connected to the drain electrode through the second via hole, and forms the lightly doped area and the heavily doped area in the conductive channel includes:

depositing the gate metal layer and the fourth photoresist layer in sequence, exposing and developing the fourth photoresist layer by a fourth mask to form a fifth photoresist pattern;

etching the gate metal layer with the fifth photoresist pattern as a mask to form the gate electrode, the first connection electrode, and the second connection electrode;

performing a first ion implantation process on the conductive channel to form the heavily doped area of the conductive channel;

performing an ion bombardment to the fifth photoresist pattern and the gate electrode with the chlorine and the oxygen to form a sixth photoresist pattern, and etching away a portion of the gate electrode;

performing a second ion implantation process on the conductive channel to form the lightly doped area of the conductive channel; and removing the sixth photoresist pattern.

In the manufacturing method of an array substrate of the present invention, the step of depositing the flat layer, performing the fifth photolithography process to form the third via hole in the flat layer above the first connection electrode includes:

depositing the flat layer and the fifth photoresist layer in sequence, exposing and developing the fifth photoresist layer by a fifth mask to form a seventh photoresist pattern;

etching the flat layer with the seventh photoresist pattern as a mask to form the third via hole in the flat layer above the first connection electrode; and removing the seventh photoresist pattern.

In the manufacturing method of an array substrate of the present invention, the step of depositing the common electrode layer, performing the sixth photolithography process to form the touch electrode and the common electrode, wherein the touch electrode is connected to the first connection electrode through the third via hole includes:

depositing the common electrode layer and the sixth photoresist layer in sequence, exposing and developing the sixth photoresist layer by a sixth mask to form an eighth photoresist pattern;

etching the common electrode layer with the eighth photoresist pattern as a mask to form the touch electrode and the common electrode; and removing the eighth photoresist pattern.

The present invention further provides a manufacturing method of an array substrate, comprising:

depositing a buffer layer and a source-drain metal layer on a substrate in sequence, performing a first photolithography process to form a source electrode, a drain electrode, and a touch line;

depositing a polysilicon layer, performing a second photolithography process to form a conductive channel, the conductive channel being disposed between the source electrode and the drain electrode, and contacting with the source electrode and the drain electrode;

depositing a gate insulating layer and a pixel electrode layer in sequence, performing a third photolithography process to form a pixel electrode, forming a first via hole in the gate insulating layer above the touch line, and forming a second via hole in the gate insulating layer above the drain electrode;

depositing a gate metal layer, performing a fourth photolithography process to form a gate electrode, a first connection electrode, and a second connection electrode, wherein the first connection electrode is connected to the touch line through the first via hole, the second connection electrode is connected to the drain electrode through the second via hole, and forming a lightly doped area and a heavily doped area in the conductive channel;

depositing a flat layer, performing a fifth photolithography process to form a third via hole in the flat layer above the first connection electrode; and depositing a common electrode layer, performing a sixth photolithography process to form a touch electrode and a common electrode, wherein the touch electrode is connected to the first connection electrode through the third via hole.

In the manufacturing method of an array substrate of the present invention, the step of depositing the buffer layer and the source-drain metal layer on the substrate in sequence, performing the first photolithography process to form the source electrode, the drain electrode, and the touch line includes:

depositing the buffer layer, the source-drain metal layer and the first photoresist layer on the substrate in sequence, exposing and developing the first photoresist layer by using a first mask to form a first photoresist pattern; and etching the source-drain metal layer with the first photoresist pattern as a mask to form the source electrode, the drain electrode, and the touch line, and removing the first photoresist pattern.

In the manufacturing method of an array substrate of the present invention, the step of depositing the polysilicon layer, performing the second photolithography process to form the conductive channel includes:

depositing an amorphous silicon layer, and performing laser annealing on the amorphous silicon layer to form the polysilicon layer;

depositing a second photoresist layer on the polysilicon layer, exposing and developing the second photoresist layer by using a second mask to form a second photoresist pattern; and etching the polysilicon layer by using the second photoresist pattern as a mask to form the conductive channel, and removing the second photoresist pattern.

In the manufacturing method of an array substrate of the present invention, the step of depositing the gate insulating layer and the pixel electrode layer in sequence, performing the third photolithography process to form the pixel electrode, forming the first via hole in the gate insulating layer above the touch line, and forming the second via hole in the gate insulating layer above the drain electrode includes:

depositing the gate insulating layer, the pixel electrode layer and the third photoresist layer in sequence, exposing and developing the third photoresist layer by using a third mask to form a third photoresist pattern;

etching the pixel electrode layer and the gate insulating layer with the third photoresist pattern as a mask to form the first via hole in the gate insulating layer above the touch line, and to form the second via hole in the gate insulating layer above the drain electrode;

performing an ion bombardment on the third photoresist pattern with oxygen to form a fourth photoresist pattern; and etching the pixel electrode layer with the fourth photoresist pattern as a mask to form the pixel electrode, and removing the fourth photoresist pattern.

In the manufacturing method of an array substrate of the present invention, the step of etching the pixel electrode layer and the gate insulating layer with the third photoresist pattern as a mask to form the first via hole in the gate insulating layer above the touch line, and to form the second via hole in the gate insulating layer above the drain electrode includes:

performing a wet etching process, etching the pixel electrode layer with the third photoresist pattern as a mask to remove the pixel electrode layer above the touch line, and removing the pixel electrode layer on the drain electrode; and performing a dry etching process, etching the gate insulating layer with the third photoresist pattern as a mask to remove the gate insulating layer above the touch line, and removing the gate insulating layer on the drain electrode.

In the manufacturing method of an array substrate of the present invention, the third mask is a halftone mask.

In the manufacturing method of an array substrate of the present invention, the step of depositing the gate metal layer, performing the fourth photolithography process to form the gate electrode, the first connection electrode, and the second connection electrode, wherein the first connection electrode is connected to the touch line through the first via hole, the second connection electrode is connected to the drain electrode through the second via hole, and forms the lightly doped area and the heavily doped area on the conductive channel includes:

depositing the gate metal layer and the fourth photoresist layer in sequence, exposing and developing the fourth photoresist layer by a fourth mask to form a fifth photoresist pattern;

etching the gate metal layer with the fifth photoresist pattern as a mask to form the gate electrode, the first connection electrode and the second connection electrode;

performing a first ion implantation process on the conductive channel to form the heavily doped area on the conductive channel;

performing an ion bombardment to the fifth photoresist pattern and the gate electrode with the chlorine gas and the oxygen to form a sixth photoresist pattern, and a portion of the gate electrode is etched away;

performing a second ion implantation process on the conductive channel to form the lightly doped area on the conductive channel; and removing the sixth photoresist pattern.

In the manufacturing method of an array substrate of the present invention, the step of depositing the flat layer, performing the fifth photolithography process to form the third via hole in the flat layer above the first connection electrode includes:

depositing the flat layer and the fifth photoresist layer in sequence, exposing and developing the fifth photoresist layer by a fifth mask to form a seventh photoresist pattern;

etching the flat layer with the seventh photoresist pattern as a mask to form the third via hole in the flat layer above the first connection electrode; and removing the seventh photoresist pattern.

In the manufacturing method of an array substrate of the present invention, the step of depositing the common electrode layer, performing the sixth photolithography process to form the touch electrode and the common electrode, wherein the touch electrode is connected to the first connection electrode through the third via hole includes:

depositing the common electrode layer and the sixth photoresist layer in sequence, exposing and developing the sixth photoresist layer by a sixth mask to form an eighth photoresist pattern;

etching the common electrode layer with the eighth photoresist pattern as a mask to form the touch electrode and the common electrode; and removing the eighth photoresist pattern.

The embodiment of the present invention further provides an array substrate, which is manufactured by the manufacturing method of the array substrate as mentioned above, the array substrate comprising:

a substrate;

a buffer layer disposed on the substrate;

a source electrode, a drain electrode, a touch line, and a conductive channel disposed on the buffer layer, the conductive channel being disposed between the source electrode and the drain electrode, and connected to the source electrode and the drain electrode;

a gate insulating layer disposed on the source electrode, the drain electrode, the touch line, the conductive channel, and the buffer layer;

a gate electrode, a first connection electrode, a second connection electrode, and a pixel electrode disposed on the gate insulating layer, the first connection electrode being connected to the touch line, and the pixel electrode being connected to the drain electrode by the second connection electrode;

a flat layer disposed on the gate electrode, the first connection electrode, the second connection electrode, the pixel electrode, and the gate insulating layer; and a touch electrode and a common electrode disposed on the flat layer, wherein the touch electrode is connected to the first connection electrode.

Beneficial Effect

An array substrate and a manufacturing method thereof in the embodiment of the present invention can complete the process of the array substrate with the touch function by using six photolithography processes, thereby simplifying the production process, saving cost, and shortening the production cycle.

DESCRIPTION OF DRAWINGS

In order to more clearly illustrate the technical solutions in the embodiments of the present invention, the drawings used in the description of the embodiments will be briefly described below. It is obvious that the drawings in the following description are only some embodiments of the present invention. For those skilled in the art, other drawings can be obtained according to these drawings without any creative work.

DETAILED DESCRIPTION OF PREFERRED EMBODIMENTS

Figure 1:
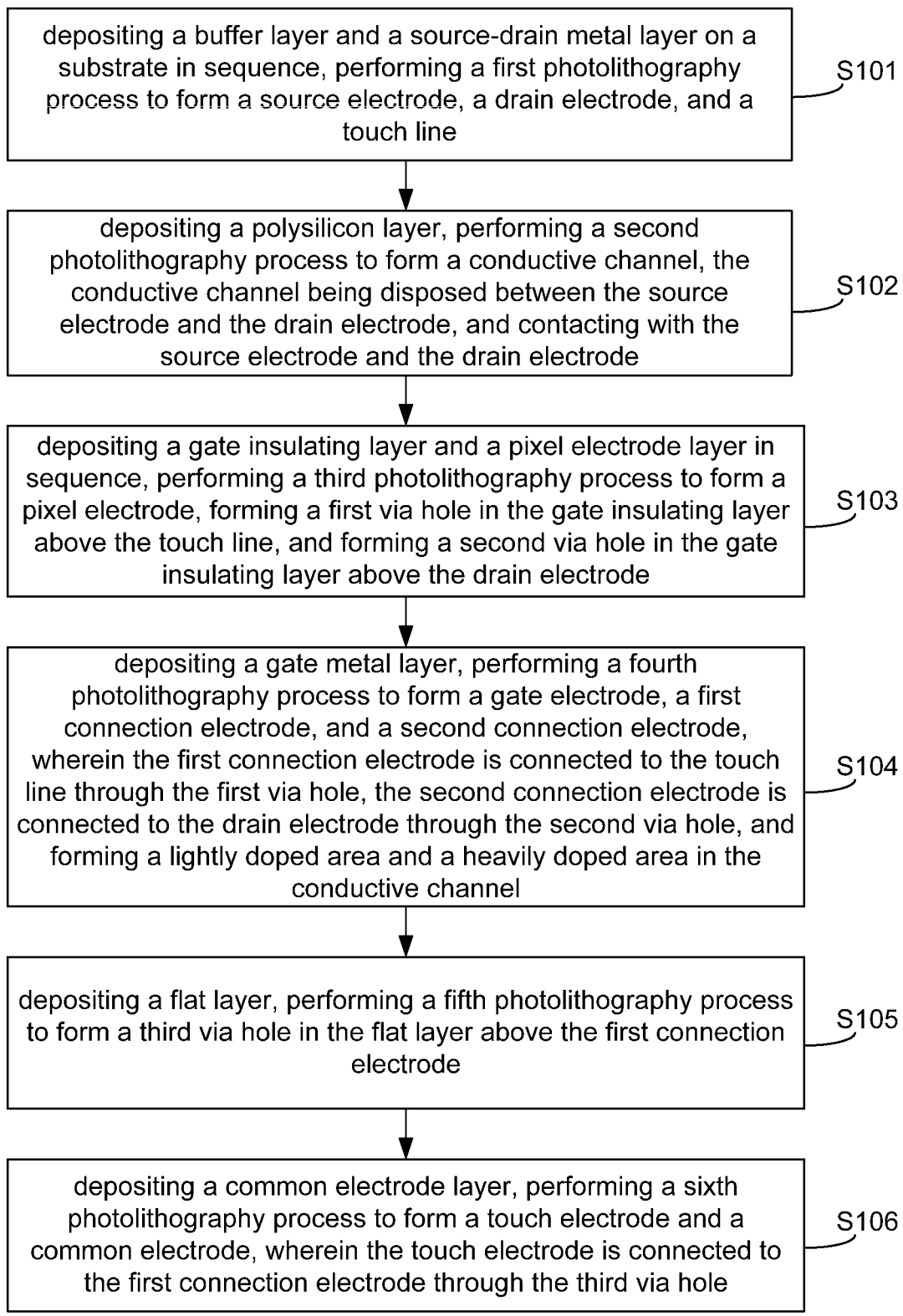
FIG. 1 is a schematic flow chart of a manufacturing method of an array substrate according to an embodiment of the present invention.

The embodiments of the present invention are described in detail below, and the examples of the embodiments are illustrated in the drawings, wherein the same or similar reference numerals are used to refer to the same or similar elements or elements having the same or similar functions. The embodiments described below with reference to the drawings are exemplified and are only used to explain the present invention, and are not to be construed as limiting the present invention.

In the description of the present invention, it is to be understood that the terms "center," "longitudinal," "transverse," "length," "width," "thickness," "upper," "lower," "front," "Orientations of "post," "left," "right," "vertical," "horizontal," "top," "bottom," "inside," "outside," "clockwise," "counterclockwise," etc. are based on the orientation or position shown in the drawings. The relationship is merely for the convenience of the description of the present invention and the simplification of the description, and is not intended to indicate or imply that the device or component referred to has a specific orientation, is constructed and operated in a specific orientation, and thus is not to be construed as limiting the application. Moreover, the terms "first" and "second" are used for descriptive purposes only and are not to be construed as indicating or implying a relative importance or implicitly indicating the number of technical features indicated. Thus, features defining "first" or "second" may include one or more of the described features either explicitly or implicitly. In the description of the present invention, the meaning of "a plurality" is two or more, unless specifically defined otherwise.

In the description of the present invention, it should be noted that the terms "installation," "link," and "connection" are to be understood broadly. For example, it may be a fixed connection, a detachable connection, or an integral connection; it may be a mechanical connection, or it may be an electrical connection or may communicate with each other; it may be directly connected, or may be indirectly connected through an intermediate medium, and may be two The internal communication of the components or the interaction of the two components. For those skilled in the art, the specific meanings of the above terms in the present invention can be understood on a case-by-case basis.

In the present invention, unless otherwise specifically defined and defined, the first feature is "on" or "under" the second feature may include that the first feature is in direct contact to the second feature, and may also include that the first feature and the second feature are not in direct contact but through additional features between them. Moreover, the first feature is "on," "above," and "under" the second feature includes the first feature is directly above and obliquely above the second feature, or merely indicating that the high of the first feature is higher than the second feature. The first feature is "below," "under," and "lower" the second feature includes the first feature is directly below and obliquely below the second feature, or merely indicating that the high of the first feature is less than the second feature.

The following disclosure provides many different embodiments or examples for implementing the different structures of the present invention. In order to simplify the disclosure of the present invention, the components and settings of the specific examples are described below. Of course, they are merely examples and are not intended to limit the invention. In addition, the present invention may repeat reference numerals and/or reference numerals in different examples, which are for the purpose of simplicity and clarity, and do not indicate the relationship between the various embodiments and/or arrangements discussed. In addition, the present invention provides examples of various specific processes and materials, but one of ordinary skill in the art will recognize the use of other processes and/or the use of other materials.

A manufacturing method of an array substrate provided by the embodiment of the present invention adopts a six-channel photolithography process to form an array substrate with a touch function. By adjusting the deposition order of a part of a film layer, using a common mask and a halftone mask, the film layer processed by each mask is arranged reasonably, the 6-channel photolithography process of the array substrate is realized, the process cycle is reduced, the production time and costs are lowed, and the production efficiency is improved.

Please refer to FIG. 1. FIG. 1 is a schematic flow chart of a manufacturing method of an array substrate according to an embodiment of the present invention. As shown in FIG. 1, the manufacturing method of the array substrate according to the embodiment of the present invention comprises:

S101. depositing a buffer layer and a source-drain metal layer on a substrate in sequence, performing a first photolithography process to form a source electrode, a drain electrode, and a touch line.

The substrate may be a glass substrate, a quartz substrate, a resin substrate or another substrate. The material of the buffer layer may be silicon dioxide, silicon nitride or silicon oxynitride. In some embodiments, the buffer layer may include a silicon nitride layer and a silicon dioxide layer which are sequentially stacked on the substrate.

Specifically, S101 includes: depositing the buffer layer, the source-drain metal layer and the first photoresist layer on the substrate in sequence, exposing and developing the first photoresist layer by using a first mask to form a first photoresist pattern; etching the source-drain metal layer with the first photoresist pattern as a mask to form the source electrode, the drain electrode, and the touch line, and removing the first photoresist pattern.

Please refer to FIGS. 2A-2D. FIGS. 2A-2D are schematic diagrams showing specific process steps of S101 in the manufacturing method of the array substrate shown in FIG. 1

Figure 2A:
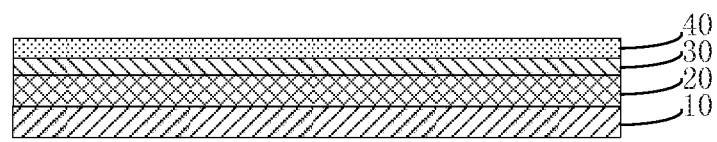
FIGS. 2A-2D are schematic diagrams showing specific process steps of step S101 in the manufacturing method of the array substrate shown in FIG. 1.

First, as shown in FIG. 2A, a buffer layer 20, a source/drain metal layer 30, and a first photoresist layer 40 are sequentially deposited on a substrate 10. The buffer layer 20, the source/drain metal layer 30 and the first photoresist layer 40 may be formed by an evaporation process, a chemical vapor deposition process, a coating process, a sol-gel process or other processes.

Figure 2B:
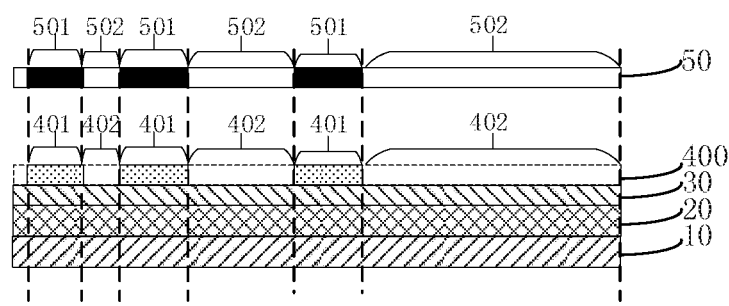

Next, please also refer to FIG. 2A and FIG. 2B, the first photoresist layer 40 is exposed and developed using a first mask 50 to form a first photoresist pattern 400. The first mask 50 is a common mask. That is, the first mask 50 includes an non-transparent area 501 and a fully transparent area 502. The first photoresist pattern 400 includes a photoresist retention area 401 and a photoresist removal area 402. The non-transparent area 501 of the first mask 50 corresponds to the photoresist retention area 401 of the first photoresist pattern 400, and the fully transparent area 502 of the first mask 50 corresponds to the photoresist removal area 402 of the first photoresist pattern 400.

Figure 2C:
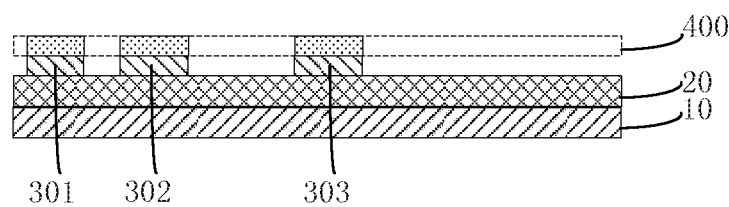
Figure 2D:
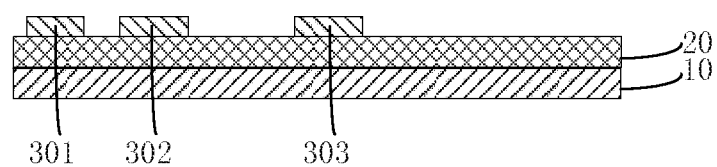

Next, please also refer to FIG. 2B and FIG. 2C, the source/drain metal layer 30 is etched by using the first photoresist pattern 400 as a mask to form a source electrode 302, a drain electrode 303, and a touch line 301. The source/drain metal layer 30 is provided with a photoresist at a corresponding position. When the source/drain metal layer 30 is etched, the corresponding position on the source/drain metal layer 30 is not etched due to the shielding of the photoresist. That is, the photoresist on the source electrode 302 is not removed at this time, the photoresist on the drain electrode 303 is not removed at this time, and the photoresist on the touch line 301 is not removed at this time.

Finally, please also refer to FIG. 2B and FIG. 2C, the first photoresist pattern 400 is removed. The photoresist on the source electrode 302, the photoresist on the drain electrode 303, and the photoresist on the touch line 301 can be removed by an ashing process.

S102. depositing a polysilicon layer, performing a second photolithography process to form a conductive channel, the conductive channel being disposed between the source electrode and the drain electrode, and contacting with the source electrode and the drain electrode.

Specifically, S102 includes: depositing an amorphous silicon layer, and performing laser annealing on the amorphous silicon layer to form the polysilicon layer; depositing a second photoresist layer on the polysilicon layer, exposing and developing the second photoresist layer using a second mask to form a second photoresist pattern; and etching the polysilicon layer by using the second photoresist pattern as a mask to form the conductive channel, and removing the second photoresist pattern.

Figure 3A:
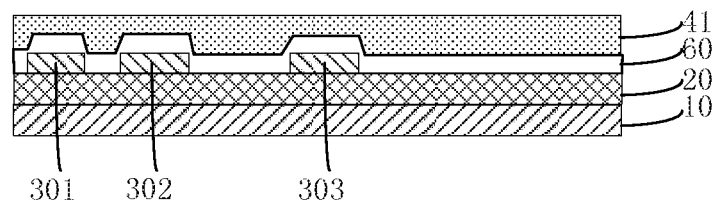
FIGS. 3A-3D are schematic diagrams showing specific process steps of step S102 in the manufacturing method of the array substrate shown in FIG. 1.

Please refer to FIGS. 3A-3D. FIGS. 3A-3D are schematic diagrams showing specific process steps of S102 in the manufacturing method of the array substrate shown in FIG. 1. First, as shown in FIG. 3A, depositing an amorphous silicon layer on the source electrode 302, the drain electrode 303, the touch line 301, and the buffer layer 20, performing laser annealing on the amorphous silicon layer to form the polysilicon layer, and depositing a second photoresist layer on the polysilicon layer. Similarly, the amorphous silicon layer and a second photoresist layer 41 may be formed by an evaporation process, a chemical vapor deposition process, a coating process, a sol-gel process, or other processes.

Figure 3B:
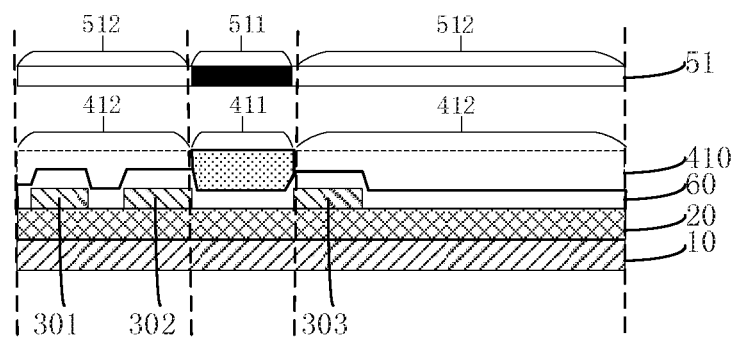

Next, please also refer to FIG. 3A and FIG. 3B, exposing and developing the second photoresist layer 41 by using a second mask 51 to form a second photoresist pattern 410. The second mask 51 is a common mask. That is, the second mask 51 includes an non-transparent area 511 and a fully transparent area 512. The second photoresist pattern 410 includes a photoresist retention area 411 and a photoresist removal area 412. The non-transparent area 511 of the second mask 51 corresponds to the photoresist retention area 411 of the second photoresist pattern 410, and the fully transparent area 512 of the second mask 51 corresponds to the photoresist removal area 412 of the second photoresist pattern 410.

Figure 3C:
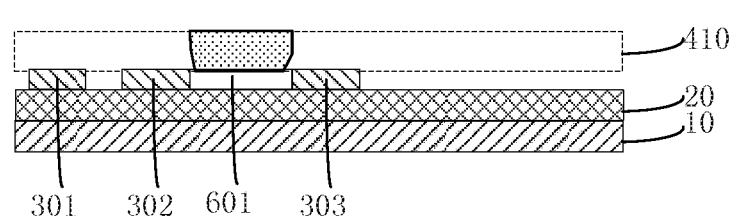

Next, please also refer to FIG. 3B and FIG. 3C, a polysilicon layer 60 is etched by using the second photoresist pattern 410 as a mask to form a conductive channel 601. The polysilicon layer 60 is provided with a photoresist at a corresponding position. When the polysilicon layer 60 is etched, the corresponding position on the polysilicon layer 60 is not etched due to the shielding of the photoresist. That is, the photoresist on the conductive channel 601 is not removed at this time.

Figure 3D:
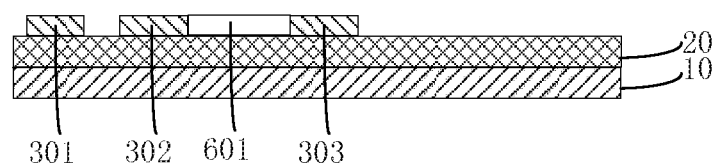

Finally, the second photoresist pattern 410 is removed as shown in FIG. 3C and FIG. 3D. Also, an ashing process can be used to remove the photoresist on the conductive channel 601.

S103, depositing a gate insulating layer and a pixel electrode layer in sequence, performing a third photolithography process to form a pixel electrode, forming a first via hole in the gate insulating layer above the touch line, and forming a second via hole in the gate insulating layer above the drain electrode.

Specifically, S103 includes depositing the gate insulating layer, the pixel electrode layer and the third photoresist layer in sequence, exposing and developing the third photoresist layer by using a third mask to form a third photoresist pattern; etching the pixel electrode layer and the gate insulating layer with the third photoresist pattern as a mask to form the first via hole in the gate insulating layer above the touch line, and to form the second via hole in the gate insulating layer above the drain electrode; performing an ion bombardment on the third photoresist pattern with oxygen to form a fourth photoresist pattern; and etching the pixel electrode layer with the fourth photoresist pattern as a mask to form the pixel electrode, and removing the fourth photoresist pattern.

Figure 4A:
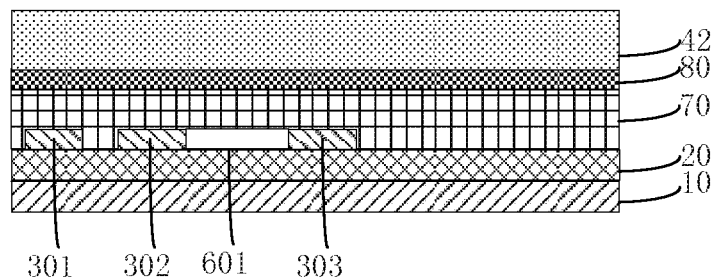
FIGS. 4A-4G are schematic diagrams showing specific process steps of step S103 in the manufacturing method of the array substrate shown in FIG. 1.

Please refer to FIGS. 4A-4G. FIGS. 4A-4G are schematic diagrams showing specific process steps of S103 in the manufacturing method of the array substrate shown in FIG. 1. First, as shown in FIG. 4A, a gate insulating layer 70, a pixel electrode layer 80, and a third photoresist layer 42 are sequentially deposited on the source electrode 302, the drain electrode 303, the touch line 301, the conductive channel 301, and the buffer layer 20. Similarly, the gate insulating layer 70, the pixel electrode layer 80, and the third photoresist layer 42 may be formed by an evaporation process, a chemical vapor deposition process, a coating process, a sol-gel process, or the like.

Figure 4B:
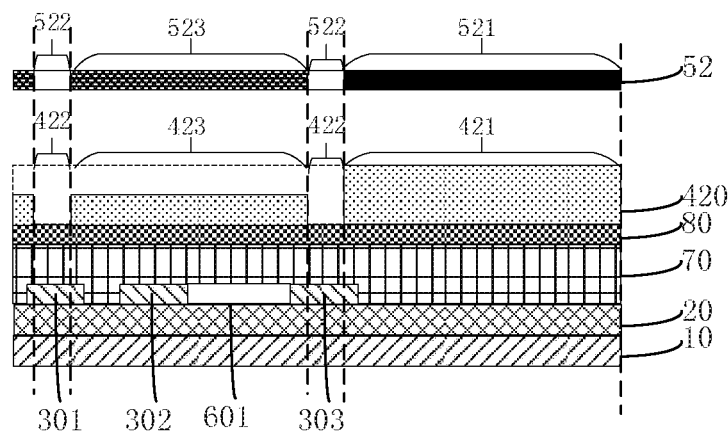

Next, please also refer to FIGS. 4A and 4B, the third photoresist layer 42 is exposed and developed by using a third mask 52 to form a third photoresist pattern 420. The third mask 52 is a halftone mask. That is, the third mask 52 includes an non-transparent area 521, a semi-transmissive area 523, and a fully transparent area 522. The third photoresist pattern 420 includes a photoresist retention area 421, a photoresist portion retention area 423, and a photoresist removal area 422. The non-transparent area 521 of the third mask 52 corresponds to the photoresist retention area 421 of the third photoresist pattern 420, and the semi-transmissive area 523 of the third mask 52 corresponds to the photoresist portion retaining area 423 of the third photoresist pattern 420, and the fully transmitting area 522 of the third mask 52 corresponds to the photoresist removing area 422 of the third photoresist pattern 420.

Figure 4C:
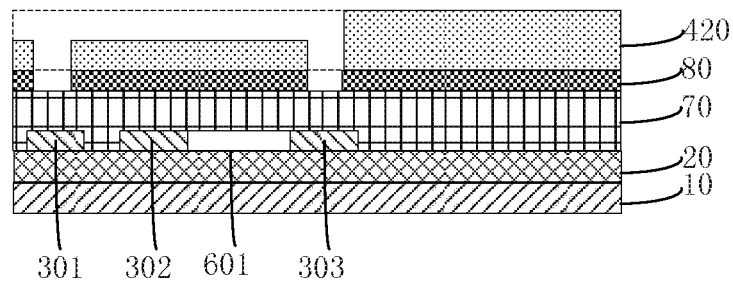
Figure 4D:
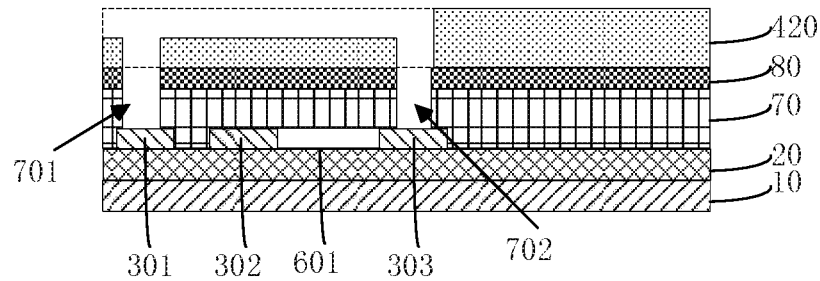

Next, as shown in FIG. 4B, FIG. 4C, and FIG. 4D, etching the pixel electrode layer 80 and the gate insulating layer 70 with the third photoresist pattern 420 as a mask to form a first via hole 701 in the gate insulating layer 70 above the touch line 301, and to form a second via hole 702 in the gate insulating layer 70 above the drain electrode 303.

Specifically, as shown in FIG. 4B and FIG. 4C, performing a wet etching process first. Etching the pixel electrode layer 80 with the third photoresist pattern 420 as a mask to remove the pixel electrode layer 80 above the touch line 301, and removing the pixel electrode layer 80 on the drain electrode 303. There is no photoresist at the corresponding position of the pixel electrode layer 80. When the pixel electrode layer 80 is etched, the corresponding position on the pixel electrode layer 80 is etched because there is no occlusion of the photoresist. Referring to FIG. 4B, FIG. 4C and FIG. 4D, performing a dry etching process, etching the gate insulating layer 70 with the third photoresist pattern 420 as a mask to remove the gate insulating layer 70 above the touch line 301, and removing the gate insulating layer 70 on the drain electrode 303. There is no photoresist at the corresponding position of the gate insulating layer 70. When the gate insulating layer 70 is etched, the corresponding position on the gate insulating layer 70 is etched due to the absence of photoresist shielding, thereby forming the first via hole 701 and second via hole 702.

Figure 4E:
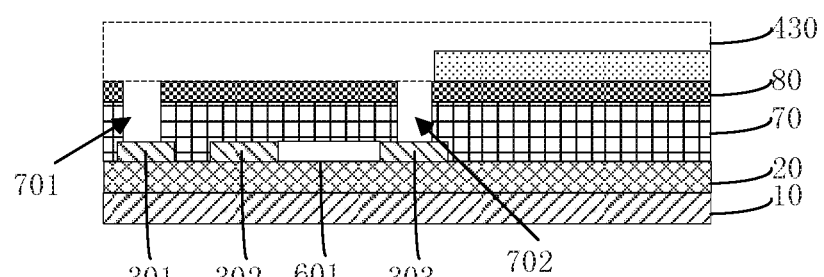

Then, as shown in FIG. 4D and FIG. 4E, performing an ion bombardment on the third photoresist pattern 420 with oxygen to form a fourth photoresist pattern 430. Ion bombardment is used to remove the remaining photoresist on the remaining portion of the photoresist and to thin the photoresist on the photoresist retention area.

Subsequently, please also refer to FIG. 4E and FIG. 4F, etching the pixel electrode layer 80 with the fourth photoresist pattern 430 as a mask to form a pixel electrode 801, The photoresist electrode layer 80 is provided with a photoresist at a corresponding position. When the pixel electrode layer 80 is etched, the corresponding position on the pixel electrode layer 80 is not etched due to the occlusion of the photoresist, thereby forming the pixel electrode 801.

Figure 4F:
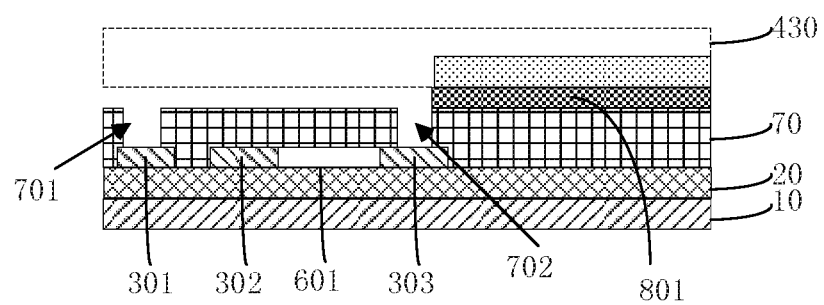
Figure 4G:
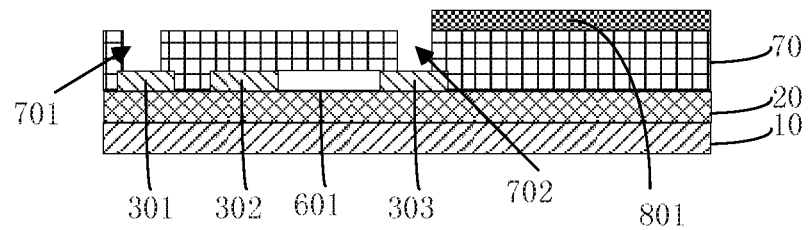

Finally, removing the fourth photoresist pattern 430 as shown in FIG. 4F and FIG. 4G. Also, an ashing process can be used to remove the photoresist on the pixel electrode 801.

S104, depositing a gate metal layer, performing a fourth photolithography process to form a gate electrode, a first connection electrode, and a second connection electrode, wherein the first connection electrode is connected to the touch line through the first via hole, the second connection electrode is connected to the drain electrode through the second via hole, and forming a lightly doped area and a heavily doped area in the conductive channel.

Specifically, S104 includes: depositing the gate metal layer and the fourth photoresist layer in sequence, exposing and developing the fourth photoresist layer by a fourth mask to form a fifth photoresist pattern; etching the gate metal layer with the fifth photoresist pattern as a mask to form the gate electrode, the first connection electrode, and the second connection electrode; performing a first ion implantation process on the conductive channel to form the heavily doped area of the conductive channel; performing an ion bombardment to the fifth photoresist pattern and the gate electrode with the chlorine and the oxygen to form a sixth photoresist pattern, and etching away a portion of the gate electrode; performing a second ion implantation process on the conductive channel to form the lightly doped area of the conductive channel; and removing the sixth photoresist pattern.

Figure 5A:
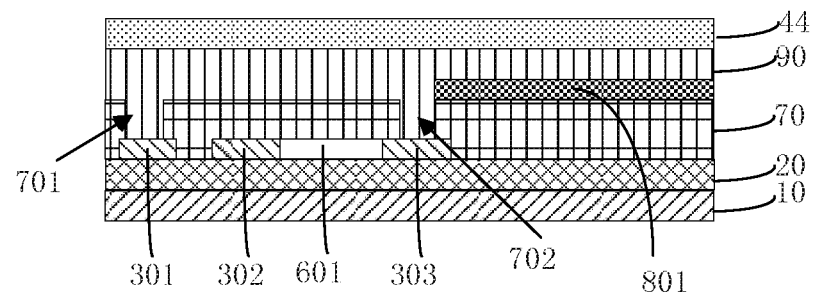
FIGS. 5A-5G are schematic diagrams showing specific process steps of step S104 in the manufacturing method of the array substrate shown in FIG. 1.

Please refer to FIGS. 5A-5G. FIGS. 5A-5G are schematic diagrams showing specific process steps of S104 in the manufacturing method of the array substrate shown in FIG. 1. First, as shown in FIG. 5A, a gate metal layer 90 and a fourth photoresist layer 44 are sequentially deposited on the gate insulating layer 70, the touch line 301, the drain 303, and the pixel electrode 801. Similarly, the gate metal layer 90 and the fourth photoresist layer 44 may be formed by an evaporation process, a chemical vapor deposition process, a coating process, a sol-gel process, or other processes.

Figure 5B:
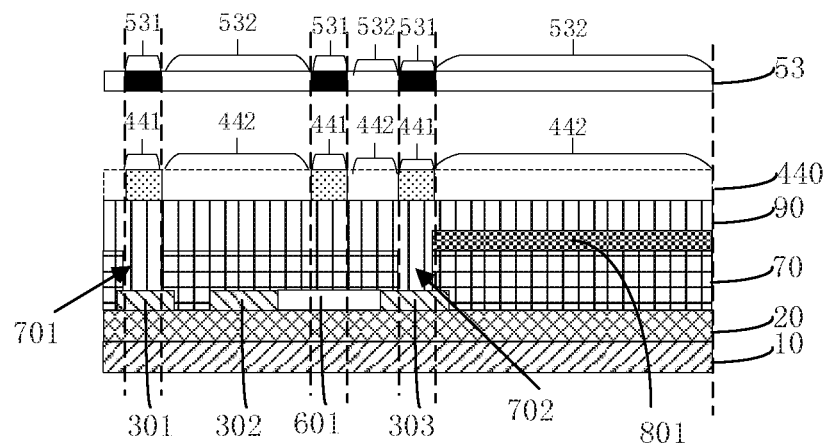

Next, please also refer to FIG. 5A and FIG. 5B, the fourth photoresist layer 44 is exposed and developed by using a fourth mask 53 to form a fifth photoresist pattern 440. The fourth mask 53 is a common mask. That is, the fifth mask 53 includes the non-transparent area 531 and the fully transparent area 532. The fifth photoresist pattern 440 includes a photoresist retention area 441 and a photoresist removal area 442. The non-transparent area 531 of the fourth mask 53 corresponds to the photoresist retention area 441 of the fifth photoresist pattern 440, and the fully transparent area 532 of the fourth mask 53 corresponds to the photoresist removal area 442 of the fifth photoresist pattern 440.

Figure 5C:
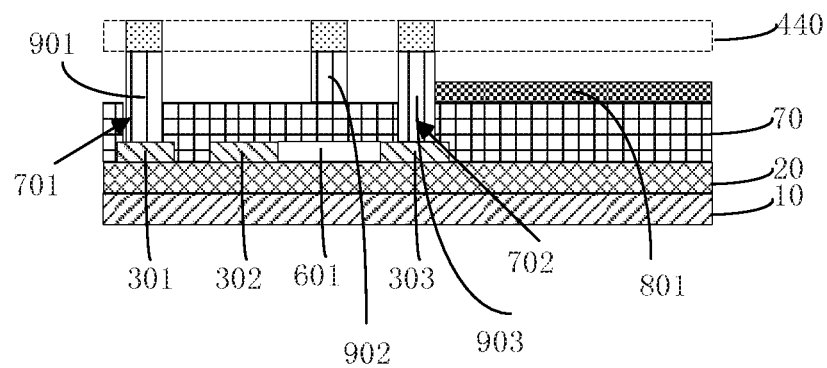

Next, please also refer to FIG. 5B and FIG. 5C, the gate metal layer 90 is etched by using the fifth photoresist pattern 440 as a mask to form a gate electrode 902, the first connection electrode 901, and the second connection electrode 903. The gate metal layer 90 is provided with a photoresist at a corresponding position. When the gate metal layer 90 is etched, the corresponding position on the gate metal layer 90 is not etched due to the shielding of the photoresist. That is, the photoresist on the gate 902 is not removed at this time, the photoresist on the first connection electrode 901 is not removed at this time, and the photoresist on the second connection electrode 903 is not etched at this time.

Figure 5D:
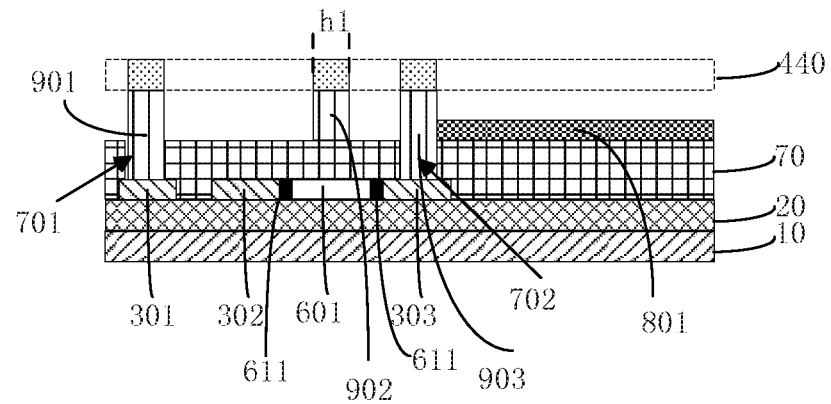

Next, please also refer to FIG. 5C and FIG. 5D, a first ion implantation process is performed on the conductive channel 601 to form a heavily doped area 611 on the conductive channel 601. Since the middle position of the conductive channel 601 is blocked by the gate 902 and the photoresist on the gate 902, when the first ion implantation process is performed on the conductive channel, a heavily doped area 611 is formed only on both sides of the conductive channel. In addition, at this time, the width of the gate 902 and the photoresist on the gate 902 is h1.

Subsequently, please also refer to FIG. 5D and FIG. 5E, the fifth photoresist pattern 440 and the gate electrode 902 are ion bombarded with chlorine gas and oxygen gas to form a sixth photoresist pattern 450, and a portion of the gate electrode 902 is etched away. The photoresist on the gate 902 is first ion bombarded with oxygen to remove photoresist on both sides of the photoresist on the gate 902. The gate 902 is again ion bombarded with chlorine gas to remove portions of the metal on both sides of the gate 902. At this time, the width of the gate 902 and the photoresist on the gate 902 is h2, and h2 is smaller than h1.

Figure 5E:
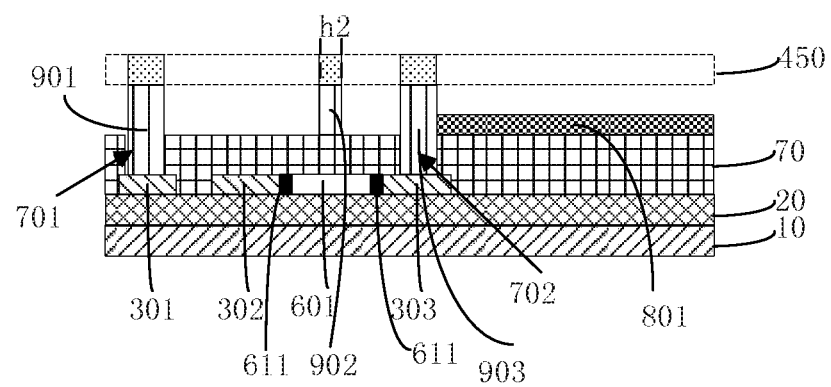
Figure 5F:
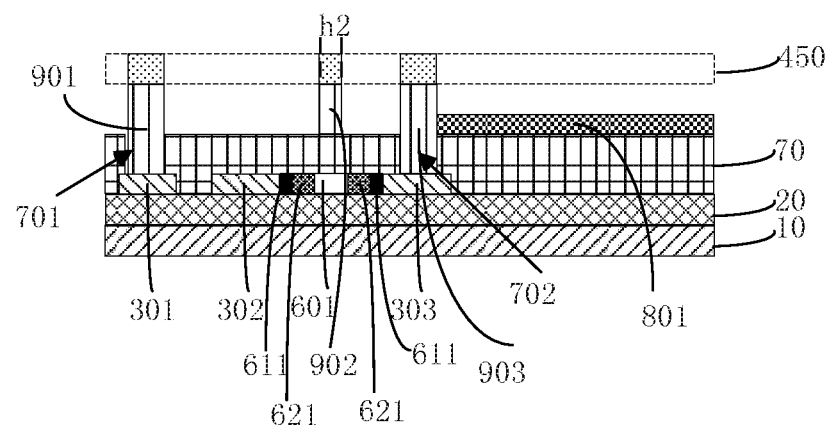

Then, please also refer to FIG. 5E and FIG. 5F, a second ion implantation process is performed on the conductive channel 601 to form a lightly doped area 621 on the conductive channel 601. Since the intermediate position of the conductive channel 601 is blocked by the gate 902 and the photoresist on the gate 902, when the conductive channel 601 is subjected to the second ion implantation process, the lightly doped area 621 is formed on both sides of the conductive channel 601.

Figure 5G:
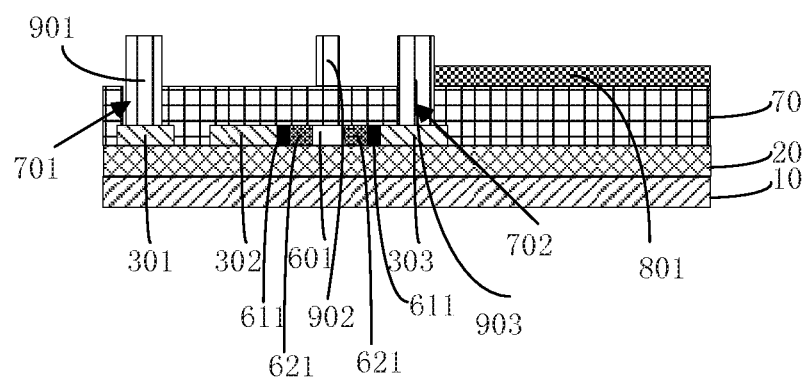

Finally, the sixth photoresist pattern 450 is removed as shown in FIG. 5F and FIG. 5G. Also, an ashing process can be used to remove the photoresist on the gate electrode 902, the photoresist on the first connection electrode 901, and the photoresist on the second connection electrode 903.

S105. depositing a flat layer, performing a fifth photolithography process to form a third via hole in the flat layer above the first connection electrode.

Figure 6A:
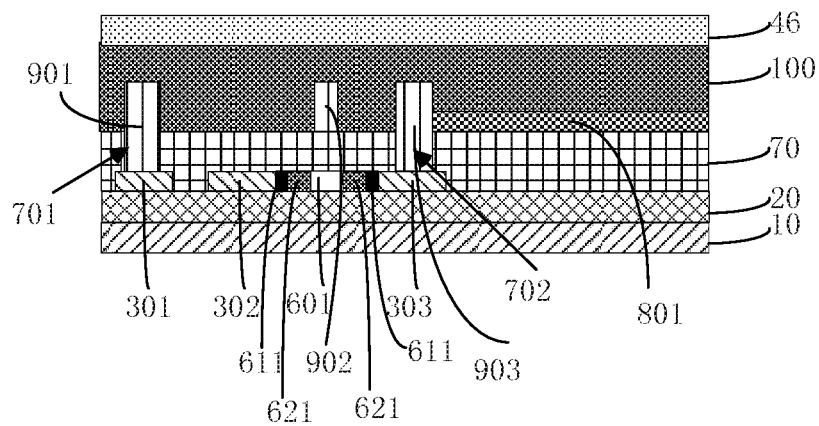
FIGS. 6A-6D are schematic diagrams showing specific process steps of step S105 in the manufacturing method of the array substrate shown in FIG. 1.

Specifically, S105 includes: depositing the flat layer and the fifth photoresist layer in sequence, exposing and developing the fifth photoresist layer by a fifth mask to form a seventh photoresist pattern; etching the flat layer with the seventh photoresist pattern as a mask to form the third via hole in the flat layer above the first connection electrode; and removing the seventh photoresist pattern Please refer to FIGS. 6A-6D. FIGS. 6A-6D are schematic diagrams showing specific process steps of S105 in the manufacturing method of the array substrate shown in FIG. 1. First, as shown in FIG. 6A, a flat layer 100 and a fifth photoresist layer 46 are sequentially deposited on the gate electrode 902, the first connection electrode 901, the second connection electrode 902, the pixel electrode 801, and the gate insulating layer 70. The flat layer 100 and the fifth photoresist layer 46 may be formed by an evaporation process, a chemical vapor deposition process, a coating process, a sol-gel process, or other processes.

Figure 6B:
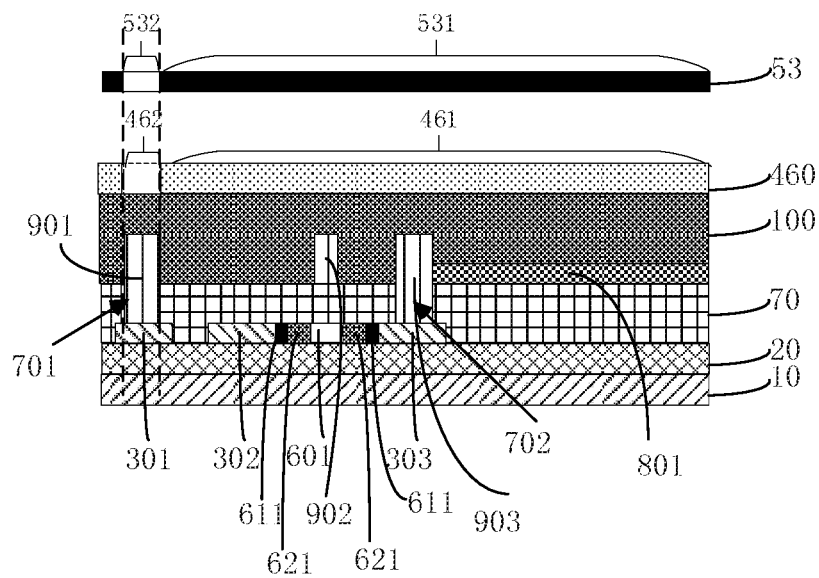

Next, please also refer to FIG. 6A and FIG. 6B, the fifth photoresist layer 46 is exposed and developed by using a fifth mask 54 to form a seventh photoresist pattern 460. The fifth mask 54 is a common mask. That is, the fifth mask 54 includes the non-transparent area 541 and the fully transparent area 542. The seventh photoresist pattern 460 includes a photoresist retention area 461 and a photoresist removal area 462. The non-transparent area 541 of the fifth mask 54 corresponds to the photoresist retention area 461 of the seventh photoresist pattern 460, and the fully transparent area 542 of the fifth mask 54 corresponds to the photoresist removal area 462 of the seventh photoresist pattern 460.

Figure 6C:
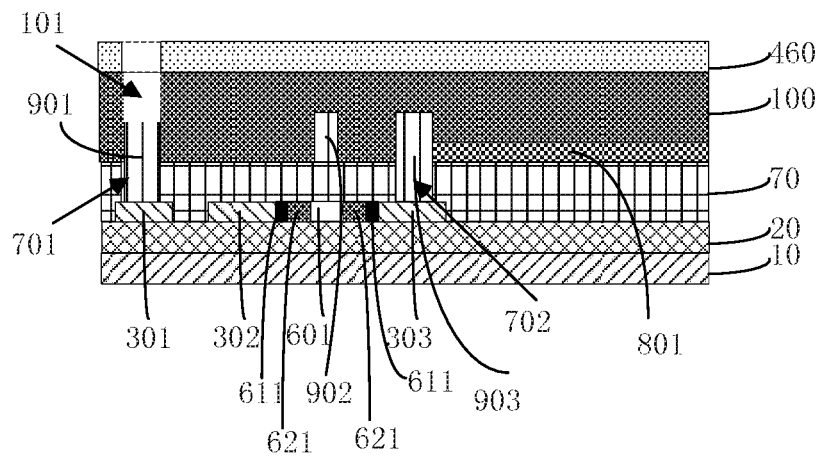

Next, as shown in FIG. 6B and FIG. 6C, the flat layer 100 is etched by using the seventh photoresist pattern 460 as a mask to form a third via hole 101 in the flat layer 100 above the first connection electrode 901. The photoresist is not disposed at corresponding positions of the flat layer 100. When the flat layer 100 is etched, the corresponding position on the flat layer 100 is etched because there is no shielding of the photoresist.

Figure 6D:
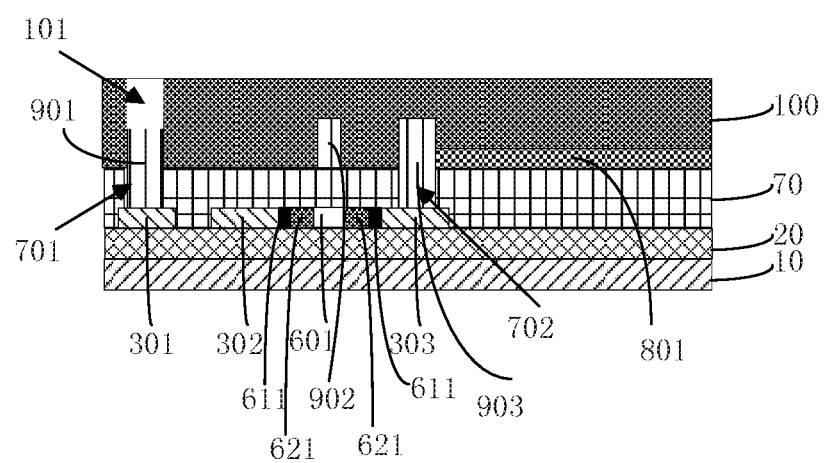

Finally, the seventh photoresist pattern 460 is removed as shown in FIG. 6C and FIG. 6D. The photoresist on the flat layer 100 can be removed by an ashing process.

S106. depositing a common electrode layer, performing a sixth photolithography process to form a touch electrode and a common electrode, wherein the touch electrode is connected to the first connection electrode through the third via hole.

Specifically, S106 includes: depositing the common electrode layer and the sixth photoresist layer in sequence, exposing and developing the sixth photoresist layer by a sixth mask to form an eighth photoresist pattern; etching the common electrode layer with the eighth photoresist pattern as a mask to form the touch electrode and the common electrode; and removing the eighth photoresist pattern.

Figure 7A:
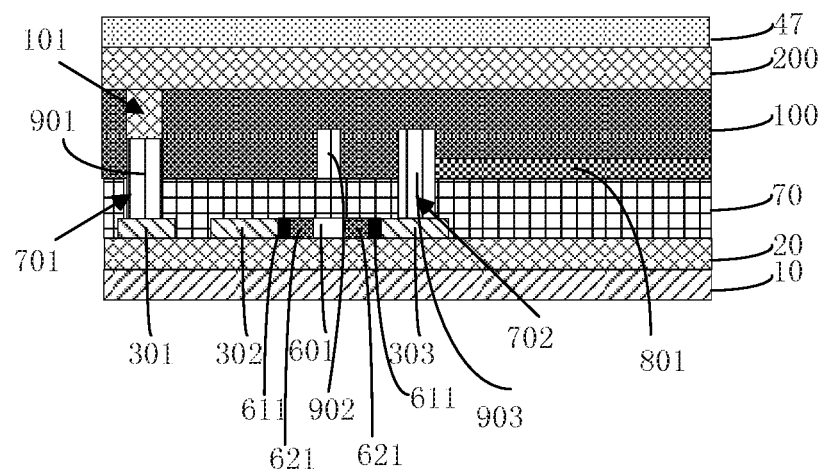
FIGS. 7A-7D are schematic diagrams showing specific process steps of step S106 in the manufacturing method of the array substrate shown in FIG. 1.

Please refer to FIGS. 7A-7D. FIGS. 7A-7D are schematic diagrams showing specific process steps of S106 in the manufacturing method of the array substrate shown in FIG. 1. First, as shown in FIG. 7A, a common electrode layer 200 and a sixth photoresist layer 47 are sequentially deposited on the first connection electrode 301 and the planarization layer 100. The common electrode layer 200 and the sixth photoresist layer 47 may be formed by an evaporation process, a chemical vapor deposition process, a coating process, a sol-gel process, or other processes.

Figure 7B:
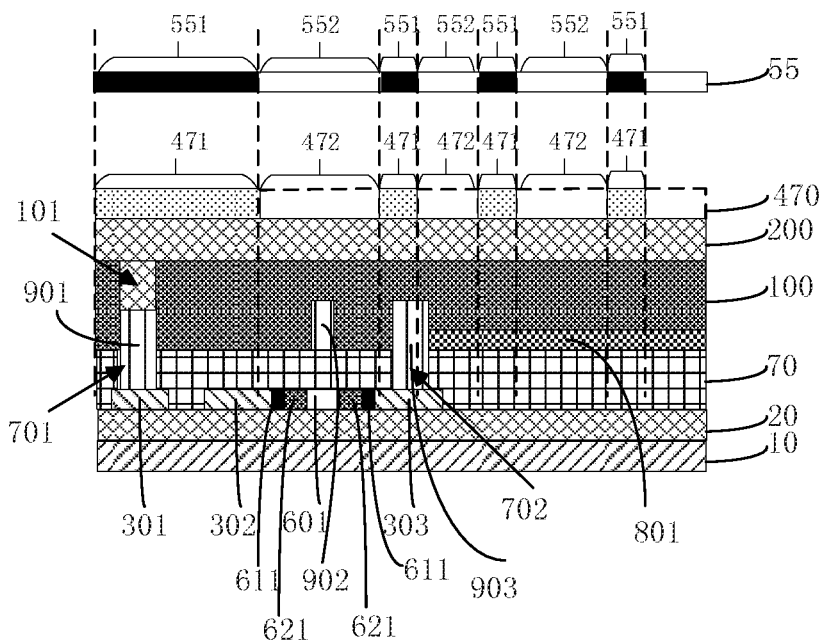

Next, please also refer to FIG. 7A and FIG. 7B, the sixth photoresist layer 470 is exposed and developed by using a sixth mask 55 to form an eighth photoresist pattern 470. The sixth mask 55 is a common mask. That is, the sixth mask 55 includes the non-transparent area 551 and the fully transparent area 552. The eighth photoresist pattern 470 includes a photoresist retention area 471 and a photoresist removal area 472. The non-transparent area 551 of the sixth mask 55 corresponds to the photoresist retention area 471 of the eighth photoresist pattern 470, and the fully transparent area 552 of the sixth mask 55 corresponds to the photoresist removal area 472 of the eighth photoresist pattern 470.

Figure 7C:
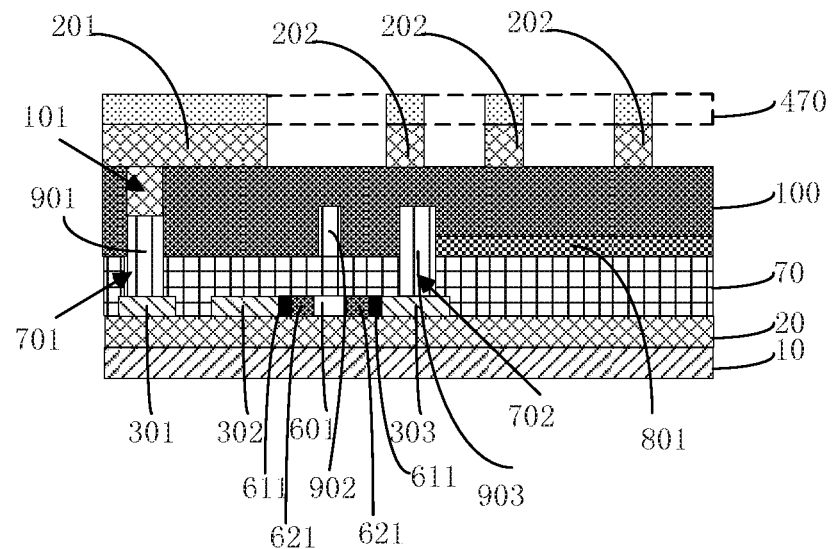

Next, please also refer to FIG. 7B and FIG. 7C, the common electrode layer 200 is etched by using the eighth photoresist pattern 470 as a mask to form a touch electrode 201 and a common electrode 202. The common electrode layer 200 is provided with a photoresist at a corresponding position. When the common electrode layer 200 is etched, the corresponding position on the common electrode layer 200 is not etched due to the shielding of the photoresist. That is, the photoresist on the touch electrode 201 is not removed at this time, and the photoresist on the common electrode 202 is not removed at this time.

Figure 7D:
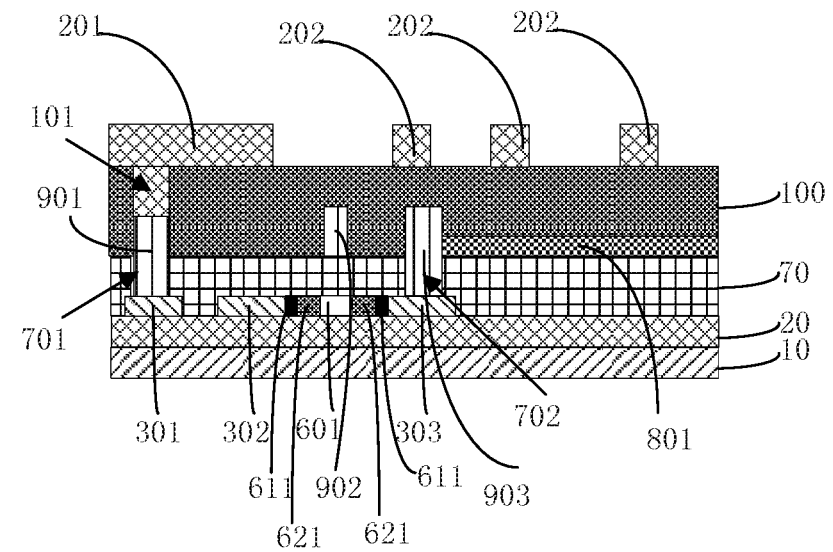

Finally, please also refer to FIGS. 7C and 7D, the eighth photoresist pattern 470 is removed. The photoresist on the touch electrode 201 and the photoresist on the common electrode 202 can be removed by an ashing process.

A manufacturing method of an array substrate in the embodiment of the present invention can complete the process of the array substrate with the touch function by using six photolithography processes, thereby simplifying the production process, saving cost, and shortening the production cycle.

Figure 8:
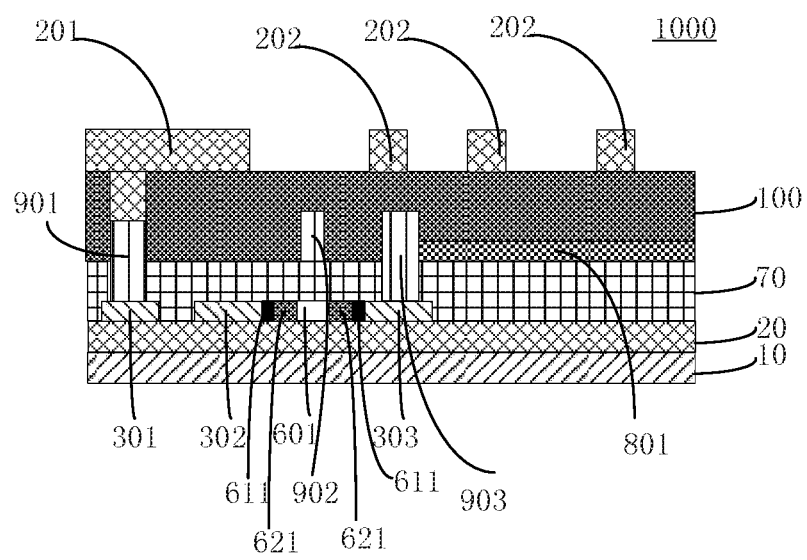
FIG. 8 is a schematic structural diagram of the array substrate according to the embodiment of the present invention.

FIG. 8 is a schematic structural diagram of the array substrate according to the embodiment of the present invention. The embodiment of the present invention further provides an array substrate 1000, which is manufactured by the manufacturing method of the array substrate according to the embodiment as mentioned above. As shown in FIG. 8, the array substrate 1000 comprises: a substrate 10; a buffer layer 20 disposed on the substrate 10; a source electrode 302, a drain electrode 303, a touch line 301, and a conductive channel 601 disposed on the buffer layer 20, the conductive channel 601 is disposed between the source electrode 302 and the drain electrode 303, and connected to the source electrode 301 and the drain electrode 303; a gate insulating layer 70 disposed on the source electrode 302, the drain electrode 303, the touch line 301, the conductive channel 601, and the buffer layer 20; a gate electrode 902, a first connection electrode 901, a second connection electrode 903, and a pixel electrode 801 disposed on the gate insulating layer 70, the first connection electrode 901 is connected to the touch line 301, and the pixel electrode 801 is connected to the drain electrode 303 by the second connection electrode 903; a flat layer 100 disposed on the gate electrode 902, the first connection electrode 901, the second connection electrode 903, the pixel electrode 801, and the gate insulating layer 70; and a touch electrode 201 and a common electrode 202 disposed on the flat layer 100, wherein the touch electrode 201 is connected to the first connection electrode 901.

In some embodiments, the lightly doped area 621 and the heavily doped area 311 are disposed on both sides of the conductive channel 601.

Although the present invention has been described with specific embodiments, but are not intended to limit the present invention. Any person skilled in the art, without departing from the spirit and scope of the present invention, can be made a number of modifications and variations of the present invention. Thus, the scope of protection of this application is subject to the scope defined by the claims.

What is claimed is:

1. A manufacturing method of an array substrate, comprising:

depositing a buffer layer and a source-drain metal layer on a substrate in sequence, performing a first photolithography process to form a source electrode, a drain electrode, and a touch line;

depositing a polysilicon layer, performing a second photolithography process to form a conductive channel, the conductive channel being disposed between the source electrode and the drain electrode, and contacting with the source electrode and the drain electrode;

depositing a gate insulating layer and a pixel electrode layer in sequence, performing a third photolithography process to form a pixel electrode, forming a first via hole in the gate insulating layer above the touch line, and forming a second via hole in the gate insulating layer above the drain electrode;

depositing a gate metal layer, performing a fourth photolithography process to form a gate electrode, a first connection electrode, and a second connection electrode, wherein the first connection electrode is connected to the touch line through the first via hole, the second connection electrode is connected to the drain electrode through the second via hole, and forming a lightly doped area and a heavily doped area in the conductive channel;

depositing a flat layer, performing a fifth photolithography process to form a third via hole in the flat layer above the first connection electrode; and depositing a common electrode layer, performing a sixth photolithography process to form a touch electrode and a common electrode, wherein the touch electrode is connected to the first connection electrode through the third via hole;

wherein the step of depositing the buffer layer and the source-drain metal layer on the substrate in sequence, performing the first photolithography process to form the source electrode, the drain electrode, and the touch line includes:

depositing the buffer layer, the source-drain metal layer and the first photoresist layer on the substrate in sequence, exposing and developing the first photoresist layer by using a first mask to form a first photoresist pattern;

etching the source-drain metal layer with the first photoresist pattern as a mask to form the source electrode, the drain electrode, and the touch line, and removing the first photoresist pattern;

the step of depositing the polysilicon layer, performing the second photolithography process to form the conductive channel includes:

depositing an amorphous silicon layer, and performing laser annealing on the amorphous silicon layer to form the polysilicon layer;

depositing a second photoresist layer on the polysilicon layer, exposing and developing the second photoresist layer using a second mask to form a second photoresist pattern; and etching the polysilicon layer by using the second photoresist pattern as a mask to form the conductive channel, and removing the second photoresist pattern.

2. The manufacturing method of the array substrate as claimed in claim 1, wherein the step of depositing the gate insulating layer and the pixel electrode layer in sequence, performing the third photolithography process to form the pixel electrode, forming the first via hole in the gate insulating layer above the touch line, and forming the second via hole in the gate insulating layer above the drain electrode includes:

depositing the gate insulating layer, the pixel electrode layer and the third photoresist layer in sequence, exposing and developing the third photoresist layer by using a third mask to form a third photoresist pattern;

etching the pixel electrode layer and the gate insulating layer with the third photoresist pattern as a mask to form the first via hole in the gate insulating layer above the touch line, and to form the second via hole in the gate insulating layer above the drain electrode;

performing an ion bombardment on the third photoresist pattern with oxygen to form a fourth photoresist pattern; and etching the pixel electrode layer with the fourth photoresist pattern as a mask to form the pixel electrode, and removing the fourth photoresist pattern.

3. The manufacturing method of the array substrate as claimed in claim 2, wherein the step of etching the pixel electrode layer and the gate insulating layer with the third photoresist pattern as a mask to form the first via hole in the gate insulating layer above the touch line, and to form the second via hole in the gate insulating layer above the drain electrode includes:

performing a wet etching process, etching the pixel electrode layer with the third photoresist pattern as a mask to remove the pixel electrode layer above the touch line, and removing the pixel electrode layer on the drain electrode; and performing a dry etching process, etching the gate insulating layer with the third photoresist pattern as a mask to remove the gate insulating layer above the touch line, and removing the gate insulating layer on the drain electrode.

4. The manufacturing method of the array substrate as claimed in claim 2, wherein the third mask is a halftone mask.

5. The manufacturing method of the array substrate as claimed in claim 1, wherein the step of depositing the gate metal layer, performing the fourth photolithography process to form the gate electrode, the first connection electrode, and the second connection electrode, wherein the first connection electrode is connected to the touch line through the first via hole, the second connection electrode is connected to the drain electrode through the second via hole, and forms the lightly doped area and the heavily doped area in the conductive channel includes:

depositing the gate metal layer and the fourth photoresist layer in sequence, exposing and developing the fourth photoresist layer by a fourth mask to form a fifth photoresist pattern;

etching the gate metal layer with the fifth photoresist pattern as a mask to form the gate electrode, the first connection electrode, and the second connection electrode;

performing a first ion implantation process on the conductive channel to form the heavily doped area of the conductive channel;

performing an ion bombardment to the fifth photoresist pattern and the gate electrode with the chlorine and the oxygen to form a sixth photoresist pattern, and etching away a portion of the gate electrode;

performing a second ion implantation process on the conductive channel to form the lightly doped area of the conductive channel; and removing the sixth photoresist pattern.

6. The manufacturing method of the array substrate as claimed in claim 1, wherein the step of depositing the flat layer, performing the fifth photolithography process to form the third via hole in the flat layer above the first connection electrode includes:
- depositing the flat layer and the fifth photoresist layer in sequence, exposing and developing the fifth photoresist layer by a fifth mask to form a seventh photoresist pattern;
- etching the flat layer with the seventh photoresist pattern as a mask to form the third via hole in the flat layer above the first connection electrode; and
- removing the seventh photoresist pattern.

7. The manufacturing method of the array substrate as claimed in claim 1, wherein the step of depositing the common electrode layer, performing the sixth photolithography process to form the touch electrode and the common electrode, wherein the touch electrode is connected to the first connection electrode through the third via hole includes:
- depositing the common electrode layer and the sixth photoresist layer in sequence, exposing and developing the sixth photoresist layer by a sixth mask to form an eighth photoresist pattern;
- etching the common electrode layer with the eighth photoresist pattern as a mask to form the touch electrode and the common electrode; and
- removing the eighth photoresist pattern.

8. A manufacturing method of an array substrate, comprising:
- depositing a buffer layer and a source-drain metal layer on a substrate in sequence, performing a first photolithography process to form a source electrode, a drain electrode, and a touch line;
- depositing a polysilicon layer, performing a second photolithography process to form a conductive channel, the conductive channel being disposed between the source electrode and the drain electrode, and contacting with the source electrode and the drain electrode;
- depositing a gate insulating layer and a pixel electrode layer in sequence, performing a third photolithography process to form a pixel electrode, forming a first via hole in the gate insulating layer above the touch line, and forming a second via hole in the gate insulating layer above the drain electrode;
- depositing a gate metal layer, performing a fourth photolithography process to form a gate electrode, a first connection electrode, and a second connection electrode, wherein the first connection electrode is connected to the touch line through the first via hole, the second connection electrode is connected to the drain electrode through the second via hole, and forming a lightly doped area and a heavily doped area in the conductive channel;
- depositing a flat layer, performing a fifth photolithography process to form a third via hole in the flat layer above the first connection electrode; and
- depositing a common electrode layer, performing a sixth photolithography process to form a touch electrode and a common electrode, wherein the touch electrode is connected to the first connection electrode through the third via hole.

9. The manufacturing method of the array substrate as claimed in claim 8, wherein the step of depositing the buffer layer and the source-drain metal layer on the substrate in sequence, performing the first photolithography process to form the source electrode, the drain electrode, and the touch line includes:
- depositing the buffer layer, the source-drain metal layer and the first photoresist layer on the substrate in sequence, exposing and developing the first photoresist layer by using a first mask to form a first photoresist pattern; and
- etching the source-drain metal layer with the first photoresist pattern as a mask to form the source electrode, the drain electrode, and the touch line, and removing the first photoresist pattern.

10. The manufacturing method of the array substrate as claimed in claim 8, wherein the step of depositing the polysilicon layer, performing the second photolithography process to form the conductive channel includes:
- depositing an amorphous silicon layer, and performing laser annealing on the amorphous silicon layer to form the polysilicon layer;
- depositing a second photoresist layer on the polysilicon layer, exposing and developing the second photoresist layer by using a second mask to form a second photoresist pattern; and
- etching the polysilicon layer by using the second photoresist pattern as a mask to form the conductive channel, and removing the second photoresist pattern.

11. The manufacturing method of the array substrate claimed in claim 8, wherein the step of depositing the gate insulating layer and the pixel electrode layer in sequence, performing the third photolithography process to form the pixel electrode, forming the first via hole in the gate insulating layer above the touch line, and forming the second via hole in the gate insulating layer above the drain electrode includes:
- depositing the gate insulating layer, the pixel electrode layer and the third photoresist layer in sequence, exposing and developing the third photoresist layer by using a third mask to form a third photoresist pattern;
- etching the pixel electrode layer and the gate insulating layer with the third photoresist pattern as a mask to form the first via hole on the gate insulating layer above the touch line, and to form the second via hole in the gate insulating layer above the drain electrode;
- performing an ion bombardment on the third photoresist pattern with oxygen to form a fourth photoresist pattern; and
- etching the pixel electrode layer with the fourth photoresist pattern as a mask to form the pixel electrode, and removing the fourth photoresist pattern.

12. The manufacturing method of the array substrate as claimed in claim 11, wherein the step of etching the pixel electrode layer and the gate insulating layer with the third photoresist pattern as a mask to form the first via hole in the gate insulating layer above the touch line, and to form the second via hole in the gate insulating layer above the drain electrode includes:
- performing a wet etching process, etching the pixel electrode layer with the third photoresist pattern as a mask to remove the pixel electrode layer above the touch line, and removing the pixel electrode layer on the drain electrode; and
- performing a dry etching process, etching the gate insulating layer with the third photoresist pattern as a mask to remove the gate insulating layer above the touch line, and removing the gate insulating layer on the drain electrode.

13. The manufacturing method of the array substrate as claimed in claim 11, wherein the third mask is a halftone mask.

14. The manufacturing method of the array substrate as claimed in claim 8, wherein the step of depositing the gate metal layer, performing the fourth photolithography process to form the gate electrode, the first connection electrode, and the second connection electrode, wherein the first connection electrode is connected to the touch line through the first via hole, the second connection electrode is connected to the drain electrode through the second via hole, and forms the lightly doped area and the heavily doped area on the conductive channel includes:

depositing the gate metal layer and the fourth photoresist layer in sequence, exposing and developing the fourth photoresist layer by a fourth mask to form a fifth photoresist pattern;

etching the gate metal layer with the fifth photoresist pattern as a mask to form the gate electrode, the first connection electrode and the second connection electrode;

performing a first ion implantation process on the conductive channel to form the heavily doped area on the conductive channel;

performing an ion bombardment to the fifth photoresist pattern and the gate electrode with the chlorine gas and the oxygen to form a sixth photoresist pattern, and a portion of the gate electrode is etched away;

performing a second ion implantation process on the conductive channel to form the lightly doped area on the conductive channel; and removing the sixth photoresist pattern.

15. The manufacturing method of the array substrate as claimed in claim 8, wherein the step of depositing the flat layer, performing the fifth photolithography process to form the third via hole in the flat layer above the first connection electrode includes:

depositing the flat layer and the fifth photoresist layer in sequence, exposing and developing the fifth photoresist layer by a fifth mask to form a seventh photoresist pattern;

etching the flat layer with the seventh photoresist pattern as a mask to form the third via hole in the flat layer above the first connection electrode; and removing the seventh photoresist pattern.

16. The manufacturing method of the array substrate as claimed in claim 8, wherein the step of depositing the common electrode layer, performing the sixth photolithography process to form the touch electrode and the common electrode, wherein the touch electrode is connected to the first connection electrode through the third via hole includes:

depositing the common electrode layer and the sixth photoresist layer in sequence, exposing and developing the sixth photoresist layer by a sixth mask to form an eighth photoresist pattern;

etching the common electrode layer with the eighth photoresist pattern as a mask to form the touch electrode and the common electrode; and removing the eighth photoresist pattern.

\* \* \* \* \*